(12) United States Patent
Maheshwari

(10) Patent No.: US 6,854,102 B1
(45) Date of Patent: Feb. 8, 2005

(54) SYSTEM AND METHOD OF ACQUIRING DELAY, SETUP AND HOLD VALUES FOR INTEGRATED CIRCUIT CELLS

(75) Inventor: Dinesh Maheshwari, Fremont, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 120 days.

(21) Appl. No.: 10/229,527

(22) Filed: Aug. 27, 2002

Related U.S. Application Data (60) Provisional application No. 60/315,292, filed on Aug. 27, 2001.

(51) Int. Cl.[7] ............................................. G06F 17/50
(52) U.S. Cl. ............................................. 716/6; 716/4
(58) Field of Search ........................................ 716/6, 4

(56) References Cited

U.S. PATENT DOCUMENTS 5,555,187 A * 9/1996 Spyrou .......................... 716/6
5,740,347 A * 4/1998 Avidan .......................... 714/33

* cited by examiner

Primary Examiner—Leigh M. Garbowski
Assistant Examiner—Brandon Bowers
(74) Attorney, Agent, or Firm—Wagner, Murabito & Hao LLP (57) ABSTRACT

The method of the present invention acquires delay, setup and hold values that appropriately reflect the timing characteristics of an integrated circuit represented by a cell file. A data and clock input slope pair is selected and the data setup time value is swept with respect to the clock. For each setup value a corresponding hold value is determined for functional failure. Then for each setup and hold value pair a delay value is ascertained. In one exemplary implementation optimal delay, setup and hold values are determined and utilized to facilitate higher frequency designs using the same physical cell layout library.

20 Claims, 9 Drawing Sheets

100

```
┌─────────────────────────────────────────────────────┐
│ SELECTING A LOAD, CLOCK SIGNAL AND DATA SIGNAL INPUT│
│                    SLOPE VALUE.                     │
│                        110                          │
└─────────────────────────────────────────────────────┘
                          │
                          ▼
┌─────────────────────────────────────────────────────┐
│ SWEEPING A DATA SETUP TIME THROUGH A PLURALITY OF   │
│     VALUES WITH RESPECT TO THE CLOCK SIGNAL.        │
│                        120                          │
└─────────────────────────────────────────────────────┘
                          │
                          ▼
┌─────────────────────────────────────────────────────┐
│  DETERMINING A CORRESPONDING HOLD TIME FOR EACH SETUP│
│                        TIME.                        │
│                        130                          │
└─────────────────────────────────────────────────────┘
                          │
                          ▼
┌─────────────────────────────────────────────────────┐
│  DETERMINING THE DELAY THROUGH A CELL FOR EACH SETUP│
│                     TIME VALUE.                     │
│                        140                          │
└─────────────────────────────────────────────────────┘
```

SYSTEM AND METHOD OF ACQUIRING DELAY, SETUP AND HOLD VALUES FOR INTEGRATED CIRCUIT CELLS

RELATED APPLICATIONS

This application claims the benefit of commonly-owned U.S. Patent Provisional Application Ser. No. 60/315,292, filed Aug. 27, 2001, "DELAY, SETUP AND HOLD ACQUISITION FOR CELLS IN A STANDARD LIBRARY" which is hereby incorporated by this reference.

TECHNICAL FIELD

This invention relates to the field of integrated circuit design. More particularly, the present invention relates to a method for acquiring cell timing parameter values.

BACKGROUND ART

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Electronic systems designed to provide these benefits often include integrated circuits (ICs) that involve complicated timing issues. Appropriate timing design considerations are usually critical for a device to achieve proper functionality. Establishing appropriate timing design values is often very complex and consumes significant resources.

The complexity of commonly used integrated circuits has advanced dramatically and design efforts usually require the assistance of computer aided design (CAD) tools. The automated development of complex integrated circuits such as application specific integrated circuits (ASICs) is referred to as electronic design automation (EDA). EDA tools are usually software programs that provide instructions to a computer for processing information associated with a circuit design. Usually, input information for an EDA tool includes characteristics and functional attributes of a circuit in varying levels of abstraction (e.g., from functional operation to physical structure). It is often convenient to group various components of complex circuits (e.g., an ASC) into a "block" or "cell" that performs a particular function or operation. The cells are combined to obtain a desired integrated circuit device design. These cells are often described and included in an EDA tool cell file. For example a cell file can represent a sequential element (e.g., a flip flop, a latch, etc.), a combinational logic element (e.g., an AND gate, OR gate, etc.) and/or both a circuit that includes both types of elements.

Cells files that include sequential elements are usually assigned timing values including delay, setup, and hold values. The actual delay, setup and hold values are determined by the inherent characteristics of the components included in each cell. The sequential cell delay, setup, and hold characteristics of a cell directly affect the proper functionality of a circuit. The characteristics are utilized in determining a variety of design constraints and making a number of design decisions. For example, delay, setup and hold timing constrains directly impact the maximum possible frequency at which an integrated circuit can reliable operate to provide desired functionality. Since delay, setup and hold characteristics are often crucial to the proper functionality of a device, including appropriate values in an EDA cell file is very important.

Traditional attempts at ascertaining appropriate delay, setup and hold values usually rely upon assumptions that may not be accurate and often result in design errors. For example, some traditional methods acquire the delay as a function of input-slope and output load and acquire setup and hold as a function of input slope on the clock and data signals. Attempts at delay characterization for each input slope and output load often rely on an assumption that a data signal transition occurs well before a clock transition and is held long after the clock transition. Previous attempts at setup and hold characterization for each clock and data input are often also based upon conditions that may not reflect reality and often usually miss characterize actual values.

Traditional attempts include various permutation that take a limited approach to the interdependence of delay, setup and hold characteristics which can result in failures when implemented in silicon. For example, acquiring a setup time with infinite hold time and then acquiring a hold time with infinite setup time, for functional failure, usually does not provide values that accurately reflect actual setup and hold time. In addition, acquiring a setup time with infinite hold time and then acquiring a hold time based on the acquired setup time, for functional failure, also usually falls short of an accurate reflection of appropriate setup and hold times for a silicon circuit. Alternatively, some traditional attempts try to acquire values in a similar manner except the setup and hold acquisition is performed for a percentage delay degradation of the acquired delay instead of functional failure. The attempts relying on a percentage of delay degradation can lead to significant design flaws in some applications.

What is required is a method that facilitates consideration of the interdependence of the delay, setup and hold values.

DISCLOSURE OF THE INVENTION

The system and method of the present invention facilitate automated acquisition of delay, setup and hold values that appropriately reflect the timing characteristics of an integrated circuit cell. The values can be included in a cell file for use in computer aided design systems. Timing values for delay, setup and hold characteristics provided by the present invention facilitate reduction of circuit failures due to timing issues when a design is implemented in silicon. In one embodiment, the present invention acquires optimal delay, setup and hold values utilized to facilitate higher frequency designs using the same physical cell layout library. In one embodiment of the present invention, a load value, data input slope value and clock input slope value are selected and the data setup time value is swept with respect to the dock. For each setup value a corresponding hold value is determined for functional failure. Then for each setup and hold value pair, a delay value is ascertained. In one exemplary implementation optimal delay, setup and hold values are determined to allow for higher operational frequency of a synchronous circuit. These and other objects and advantages of the present invention will be understood to those of ordinary skill in the art after having read the following detailed description of the preferred embodiments which are illustrated in the various drawing figures.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

A system and method for acquiring timing values for integrated circuit cells in accordance with an embodiment of the present invention is disclosed. The present invention facilitates accurate determination of delay, setup and hold time values for cell files. In one embodiment of the present invention, the values are included in an electronic circuit computer aided design tool file. The file can include data for a variety of cells or a single cell. In one exemplary implementation, the data is included in a cell file as part of a library for convenient utilization in designing electronic devices.

Figure 1:
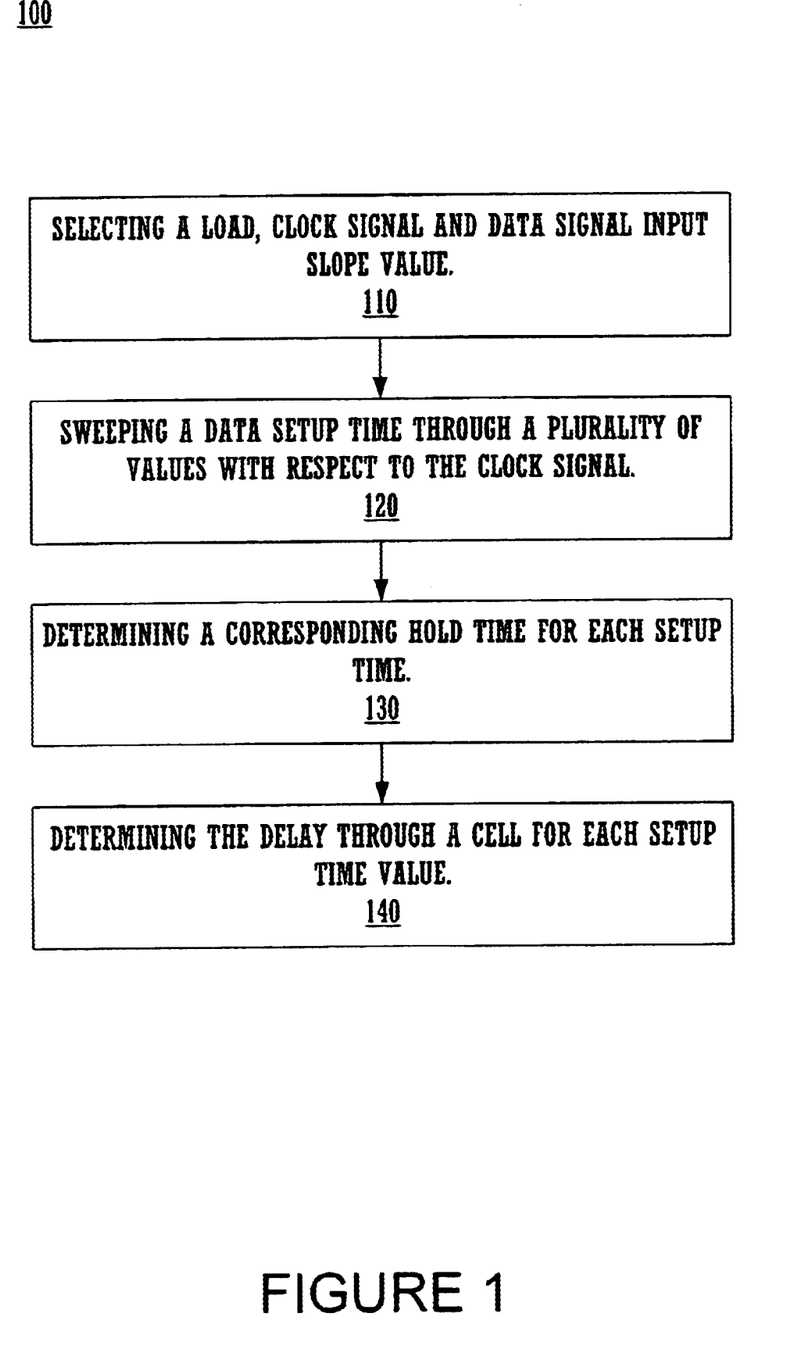
FIG. 1 is a flow diagram of a timing value acquisition method in accordance with one embodiment of the present invention.

FIG. 1 is a flow diagram of a timing value acquisition method 100, one embodiment of the present invention. Timing value acquisition method 100 includes provisions to address the interdependence of delay, setup and hold timing constraints on the proper functionality of an electronic circuit.

In step 110, a load, dock signal input slope and data signal input slope are selected. In one embodiment of the present invention the clock signal and data signal inputs are fed into a flip flop circuit. In one exemplary implementation the clock signal and data signals are fed into a latch circuit. In one exemplary implementation, varying load values are also selected in step 110.

At step 120, the data setup time is swept through a plurality of values with respect to the clock signal. In one embodiment of the present invention, the data is setup at different times with respect to a clock signal. For example, a setup value indicating a duration between a transition in a data signal and a clock signal transition is fed into a transistor level simulation and the results are analyzed.

A corresponding hold value for each setup time is determined in step 130. In one exemplary implementation, a corresponding hold time is acquired for functional failure.

In step 140, the delay through the cell for each setup time and corresponding hold time is determined. In one exemplary implementation, a transistor level simulation is run for a circuit component with a setup time value from step 120. In one embodiment of the present invention, the multiple iterations of step 130 are performed in which the load value is varied for each one of the setup values.

In one embodiment of the present invention, an optimal delay, setup and hold triplet is identified. In one exemplary implementation, an optimal delay, setup and hold triplet is selected by analyzing the sum of sequential delay and setup values to determine a minimum and then extracting a hold value that corresponds to an optimal delay and setup values. In one embodiment, optimal delay, setup and hold values are utilized to facilitate high frequency designs using the same physical cell layout library.

Figure 2:
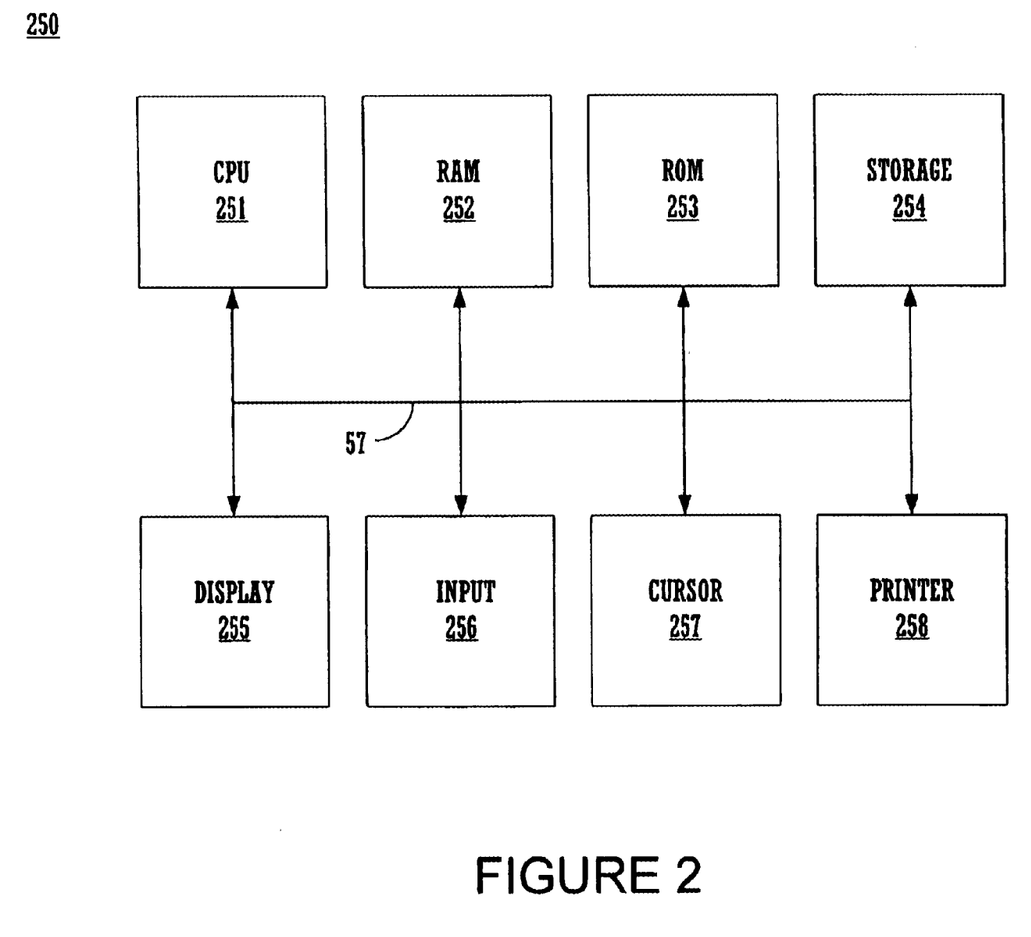
FIG. 2 is a block diagram of one embodiment of a computer platform that performs present invention timing value acquisition methods.

FIG. 2 is a block diagram of computer system 250, one embodiment of a platform that performs present invention timing value acquisition methods (e.g., timing value acquisition method 100). In general, system 250 comprises a bus 257, a central processor 251, a random access memory 252, a read only memory 253, a data storage device 254, a display device 255, an alphanumeric input device 256, a cursor control device 257 and a printer 258. Bus 257 is coupled to central processor 251, random access memory 252, read only memory 253, data storage device 254, display device 255, alphanumeric input device 256, cursor control device 257 and printer 258.

The components of system 250 cooperatively operate to perform their designated functions. Central processor 251 processes information and instructions including instructions associated with a present invention timing value acquisition method. Random access memory 252 stores information and instructions for the central processor 251 including information and instructions associated with a present invention timing value acquisition method. Read only memory 253 stores static information and instructions for the processor 251. Data storage device 254 (e.g., such as a magnetic or optical disk and disk drive) provides bulk storage for storing information and instructions. Display device 255 displays information to a computer user. Alphanumeric input device 256 includes alphanumeric and function keys for communicating information and command selections to the central processor 251. Cursor control device 257 communicates user input information and command selections to the central processor 251. Printer 258 prints documents in accordance with directions from central processor 251. Bus 257 is a path for communicating information. The components of system 250 comprise a variety of interchangeable embodiments.

Figure 3A:
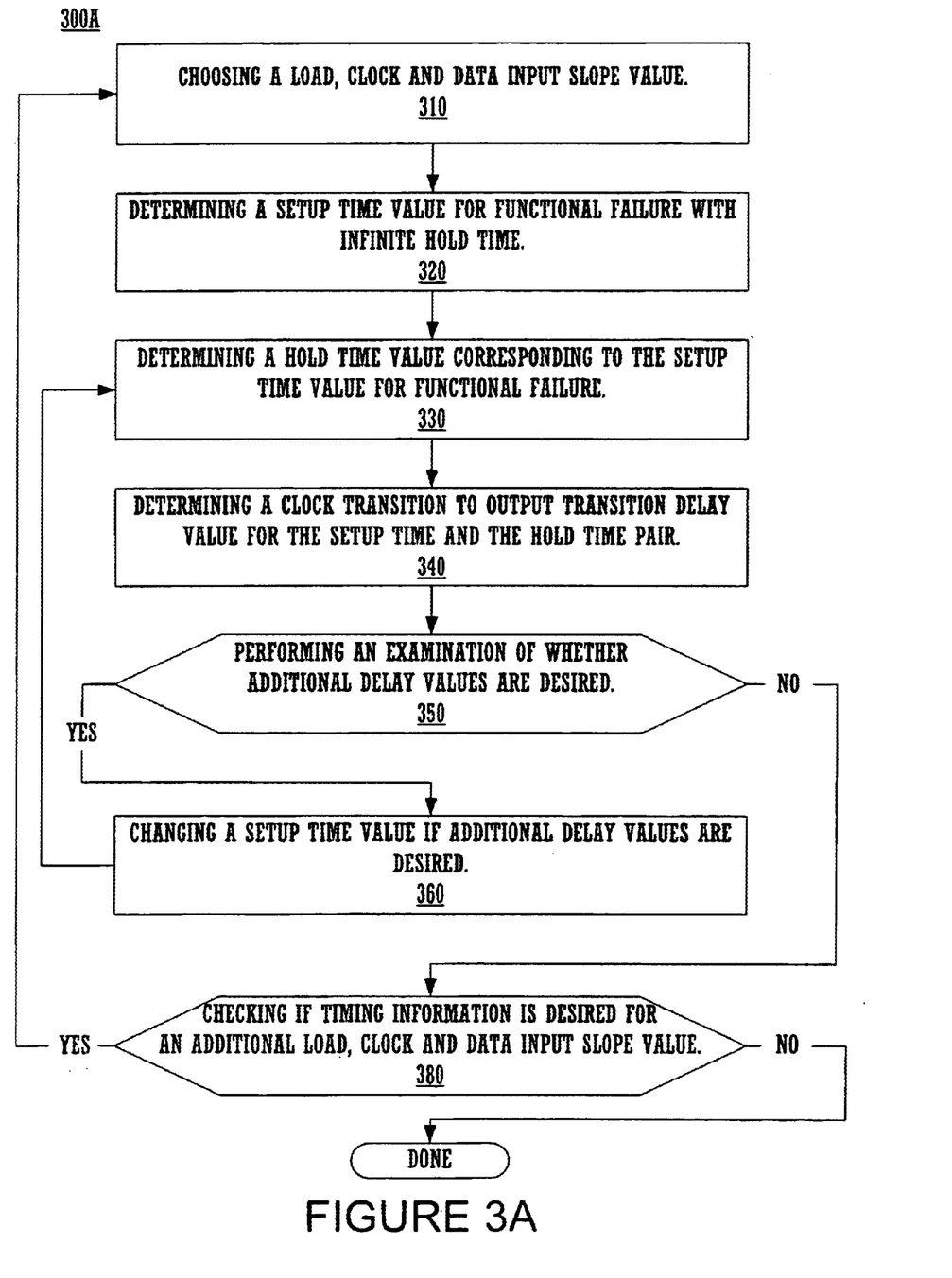
FIG. 3A is a flow diagram of a timing value acquisition method in accordance with another embodiment of the present invention.

FIG. 3A is a flow diagram timing value acquisition method 300A, one embodiment of the present invention. Timing value acquisition method 300A facilitates acquisition of sequential cell timing values. In one embodiment of the present invention, timing value acquisition method 300A acquires delay, setup and hold values for various load values, clock input slope values and data input slope values associated with a sequential cell circuit component.

In step 310 a load value, clock input slope value, and data input slope value are chosen. In one embodiment of the present invention, the load, clock input slope values and data input slope values are chosen from a pool (e.g., a table, file, etc.) of potential values for which characterization is desired. The present invention is flexible and adaptable to performing an iteration of timing value acquisition method 300A without varying the load value.

At step 320, a setup time value is established for a particular load value, dock input slope value and data input slope value. In one embodiment of the present invention, a setup time value (e.g., an initial setup time value) for functional failure with infinite hold time is determined (e.g., by running a computer aided simulation). In one exemplary implementation, a minimum setup value is acquired. Alternatively, the initial setup time value can be set to a predetermined number (e.g., zero) or an arbitrarily selected value.

At step 330, a hold time value corresponding to said setup time value for functional failure is determined. In one embodiment of the present invention, the hold time value is determined by running a computer aided simulation (e.g., SPICE simulation) of components included in the cell.

As indicated in step 340, a clock transition to output transition delay value for said setup time and said hold time pair is determined. In one embodiment the delay is determined by a computer simulation program.

In step 350, an examination of whether additional delay values are desired is performed. In one embodiment of the present invention, an examination includes an analysis of whether the delay is sufficiently sensitive to changes in the setup value. In one exemplary implementation, the change in delay values is examined to determined if it exceeds a desired percentage change. For example, an analysis to determine if a current delay value minus a previous delay value is less than a particular percentage is made.

In step 360, a setup time value is changed if additional delay values are desired (e.g., changes in delay values are sufficiently sensitive to changes in setup values). In one exemplary implementation, the minimum setup time is changed by a predetermined percentage and the process returns to step 330.

In step 380, a check whether additional timing information is desired for different load values, clock input slope values and data input slop values is performed. If further timing information is desired the process returns to step 310 for selection of a different load value, clock input slope value and data input load value "set". One or more of the parameters (e.g., load value, clock input slope value and data input load value) may be changed. For example, the load value and clock input slope value can remain the same and a different data input slope value is selected. In one embodiment, the load value, clock input slope value and data input slope value are varied either arbitrarily or in accordance with a predetermined formula and process returns to step 320 instead of 310.

In one embodiment of the present invention the acquired timing values are incorporated in cell files. In one exemplary implementation the acquired delay, setup and hold values are used to populate tables in a cell file. For example, delay values are included in a table indexed as a function of input slope and output load. In addition, setup and hold values are used to populate a table indexed as a function of data signal input slope and clock signal input slope.

In an alternate embodiment of the present invention, the load value is varied and a plurality of delay values are acquired in step 340 for each one of the setup and hold value pairs. In one exemplary implementation of this embodiment the load value is not chosen in step 310, instead it is varied in step 340.

Figure 6A:
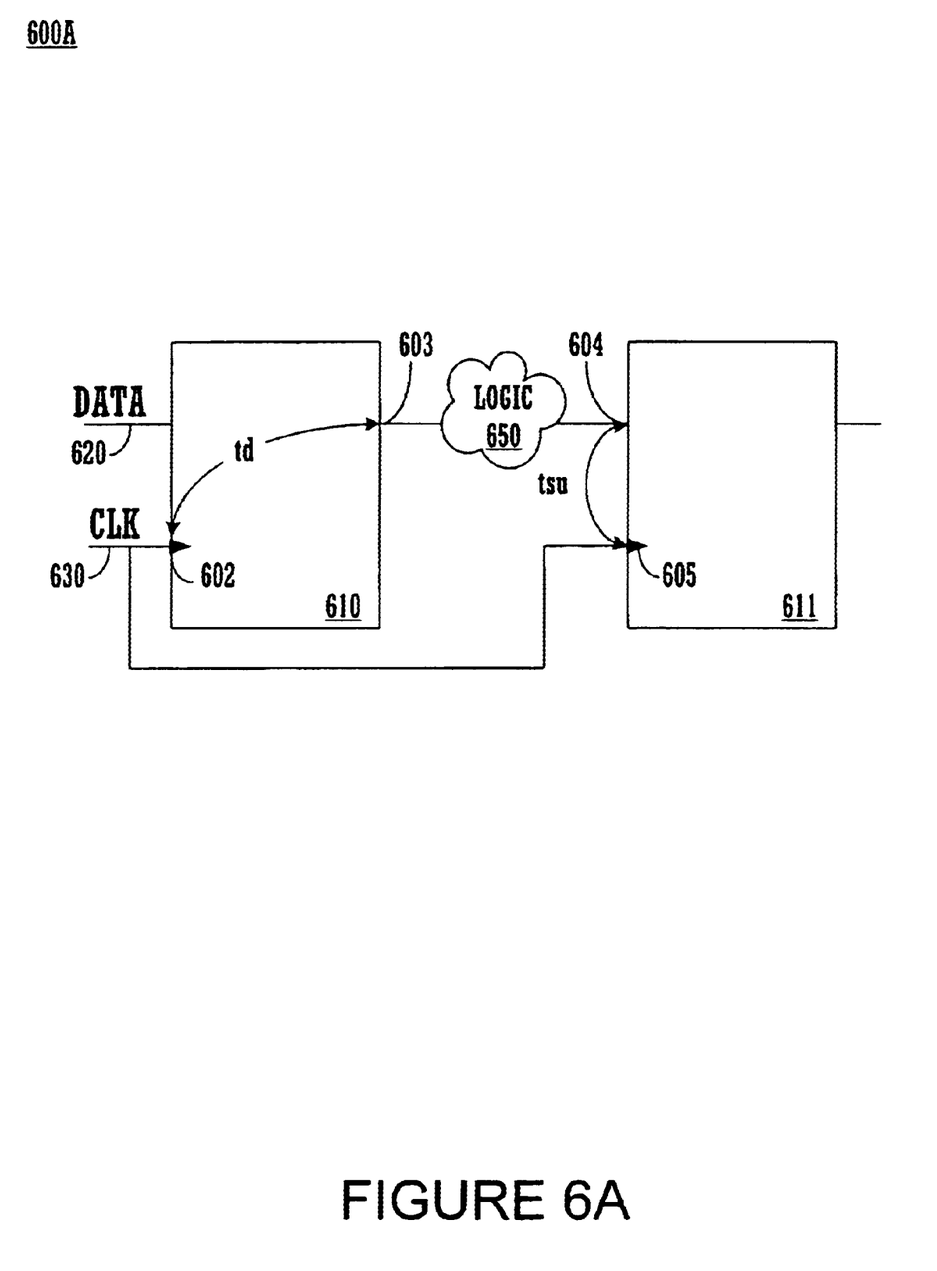
FIG. 6A is a block diagram illustration of a sequential circuit 600A which includes intermediate delay logic and can be represented by a cell file in accordance with delay, setup and hold values acquired by the present invention.
Figure 6B:
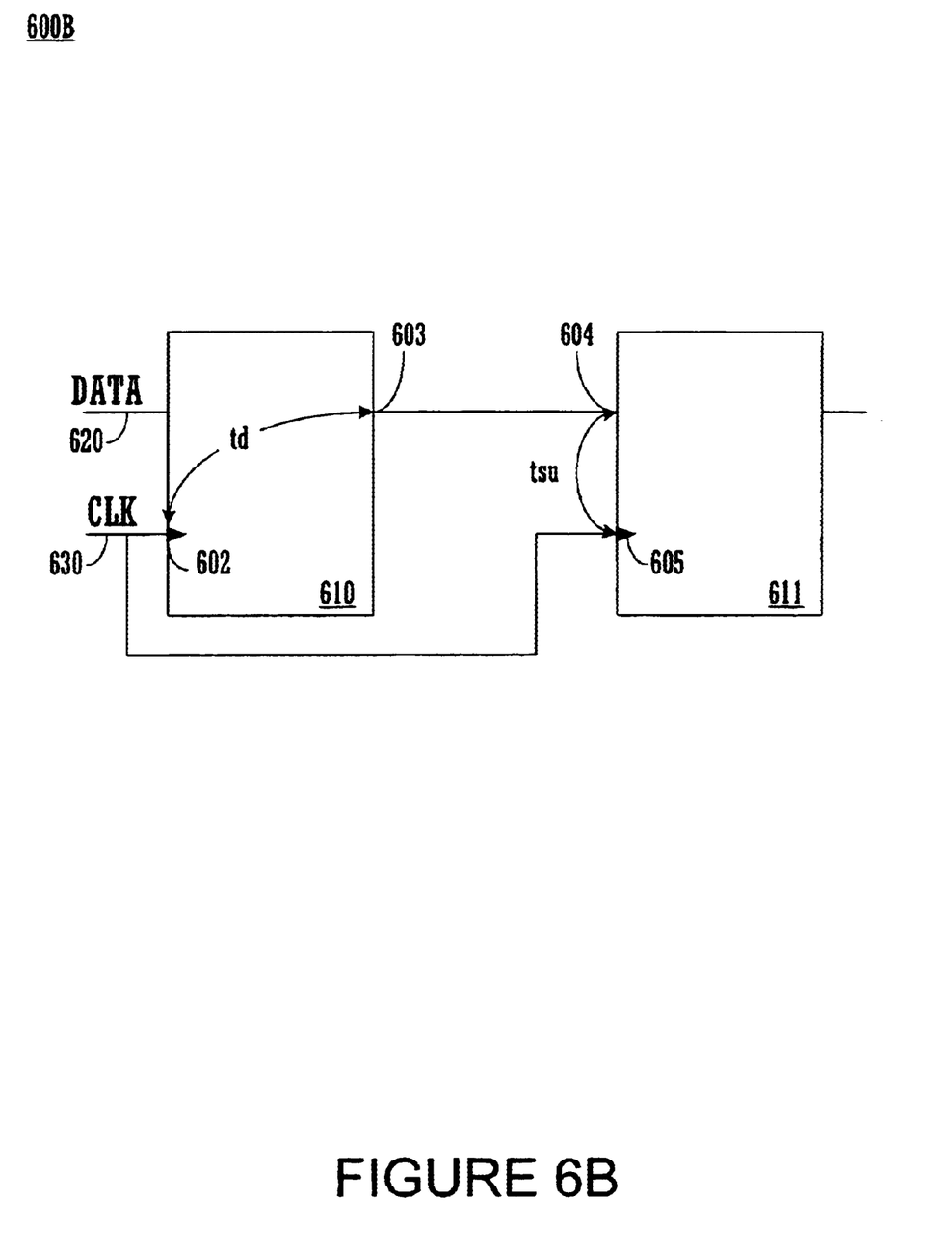
FIG. 6B is a block diagram illustration of a sequential circuit 600B without intermediate delay logic and can be represented by a cell file in accordance with delay, setup and hold values acquired by the present invention.

The present invention is also capable of utilizing the timing values provided by a present invention timing acquisition method to provide an optimal delay, setup and hold values utilized to facilitate high frequency designs using the same physical cell layout library. Synchronous circuits include a plurality of cascaded sequential components (e.g., a sequence of flip flop banks) with or without intermediate logic. For example, FIGS. 6A and 6B are block diagrams illustrating exemplary sequential circuits 600A and 600B which can be represented by a cell file in accordance with delay, setup and hold values acquired by one embodiment of the present invention. The sequential circuits 600A and 600B include flip-flops 610 and 611 and circuit 600A includes intermediate logic 650.

As shown in FIGS. 6A and 6B a clock signal is provided to flip flop 610 and 611 at clock inputs 602 and 605 respectively and data signals are provided at output port 603. There are techniques for minimizing the delay in the intermediate logic 650. In one embodiment, the results of the present invention are compatible for combination with the minimized intermediate logic delays. For circuit 600B, the minimum sequence time (e.g., fastest the clock signal can trigger the flip flops while producing reliable results) is the sum of the delay from clock trigger at clock port 602 to a data transition at data output 603 plus the setup time between a data transition at input port 604 and a clock trigger transition at clock port 605. The maximum frequency at which circuit 600B can reliably operate is defined by the equation:

$$f = 1/td_{610} + tsu_{611}$$

where f is the frequency, $td_{610}$ is the delay for circuit 610 and $tsu_{611}$ is the setup value for circuit 611. For circuit 600A, the minimum sequence time (e.g., fastest the clock signal can trigger the flip flops while producing reliable results) is the sum of the delay from clock trigger at clock port 602 to a data transition at data output 603, plus the delay of the intermediate logic, plus the setup time between a data transition at input port 604 and a clock trigger transition at clock port 605. In one exemplary implementation of a present timing value acquisition method for circuit 600A, other techniques address the intermediate logic delay and the intermediate logic delay is not addressed directly by the present invention. Given that other techniques are available to address the intermediate circuit delay, the minimum sequence time and maximum frequency for circuit 600A is determined similar to circuit 600B. In an alternate embodiment, the minimal intermediate logic delay value is determined by an alternate technique and is factored in after a present invention timing value acquisition method determines a minimum sequence time.

Figure 3B:
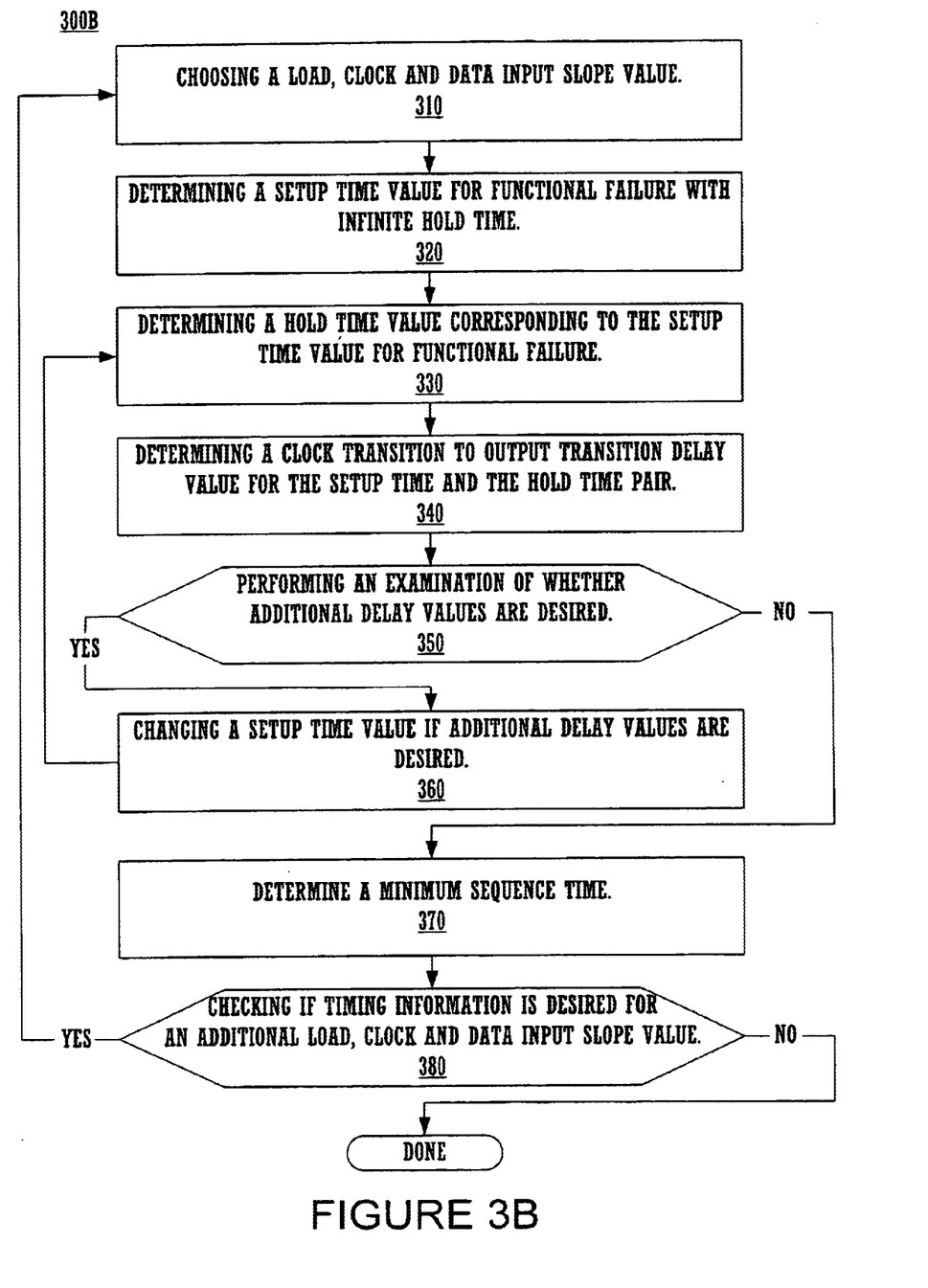
FIG. 3B is a flow diagram of a timing acquisition method in accordance with one embodiment of the present invention including a step for determining timing values corresponding to a minimum sequence time.

In one embodiment of the present invention, a timing acquisition method includes identification of optimal values for delay, setup and hold values. FIG. 3B is a flow diagram of timing acquisition method 300B in accordance with one embodiment of the present invention. Timing acquisition method 300B is similar to timing acquisition method 300A except timing acquisition method 300B includes step 370 for determining timing values corresponding to a minimum sequence time. In timing acquisition method 300B the setup time and delay time of a single sequential component (e.g., flip flop) is utilized since the cells of a synchronous design are usually similar and difference in setup values are negligible.

Figure 4:
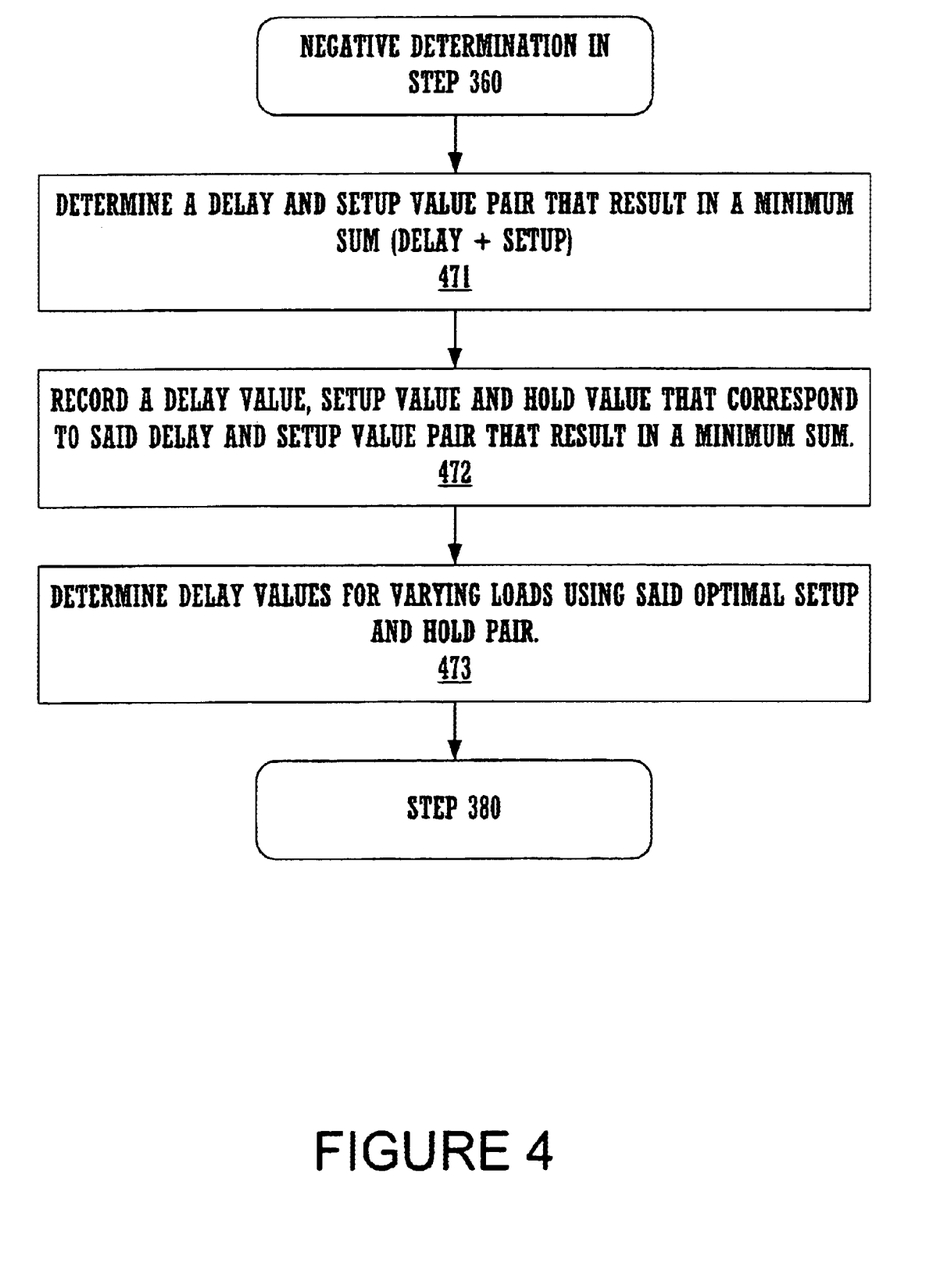
FIG. 4 is a flow diagram of determining timing values corresponding to a minimum sequence time in accordance with one embodiment of the present invention.

FIG. 4 is a flow diagram of step 370 in accordance with one embodiment of the present invention. In step 471 a delay and setup value pair that result in a minimal sum is determined. At step 472 a delay value, a setup value and a hold value that correspond to the delay and setup value pair that result in a minimal sum is recorded. The delay and setup value pair that results in a minimal sum is designated as an optimal setup and hold pair. In step 473 a delay value for varying loads using said optimal setup and hold pair is determined. In one exemplary implementation of this embodiment the load value is not chosen in step 310, but rather is varied as part of step 370.

In an alternate embodiment, separate iterations of a timing acquisition method is performed to acquire the delay, setup and hold values for each sequential component (e.g., flip flop 610 and 611) separately. The present invention then utilizes the separately acquired values to facilitate determination of optimal design characteristics. In an alternate embodiment which addresses the infrequent situation where the setup times of cascaded sequential cells 610 and 611 are not similar, the optimal delay, setup and hold values are determined by minimizing possible combinations including the delay value of 610 plus setup value of 610, the delay value of 611 plus setup value of 611, the delay value of 610 plus setup value of 611, and the delay value of 611 plus setup value of 610 simultaneously. If there are more than two sequential cells the process is expanded accordingly.

Figure 5:
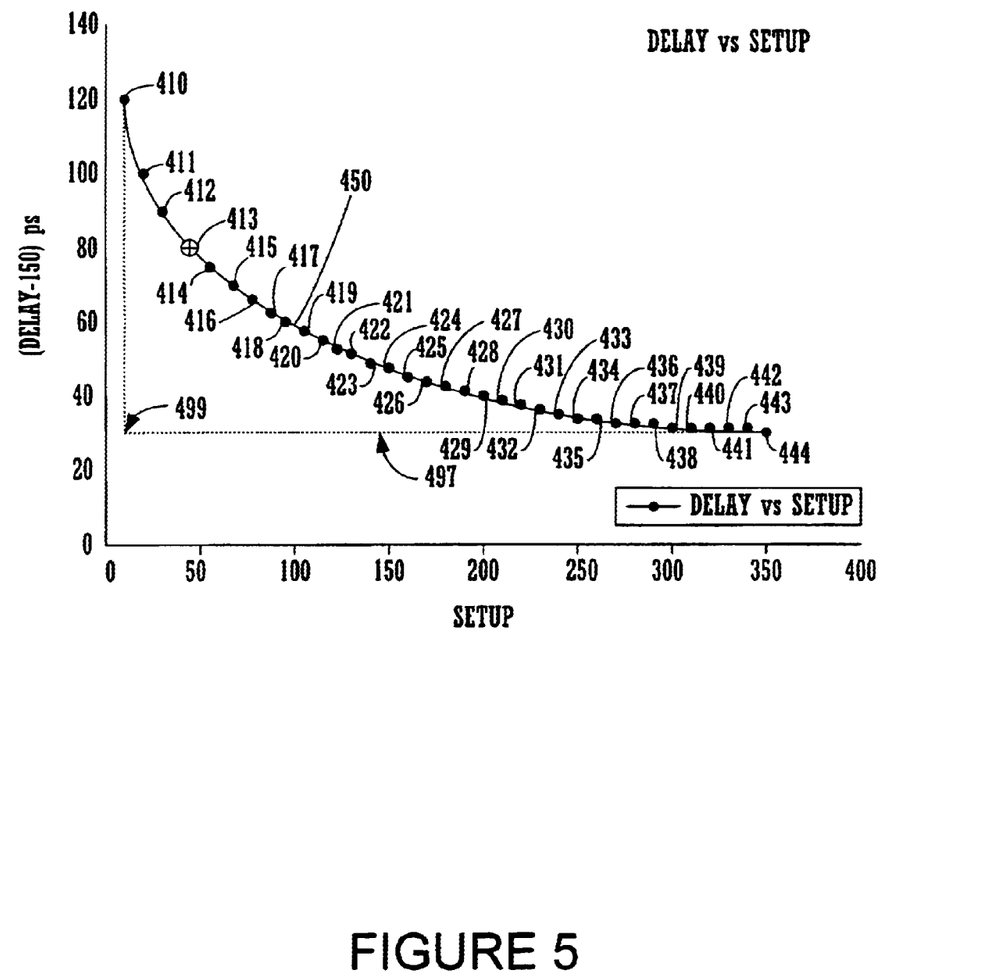
FIG. 5 is a graph illustrating a curve of an actual relationship of setup and delay times with present invention acquired setup and delay value pairs.

FIG. 5 is a graph illustrating a curve of an actual relationship of setup and delay times. Points 499 and 497 illustrate exemplary values acquired with traditional methods and their deviation form actual values. The setup and delay value pairs 410 through 444 acquired with utilization of the present invention illustrate their close proximity to the actual relationship of setup and delay times. Any of the delay value and setup value pairs acquired by the present invention, including optimal values, can be included in a cell file either singularly or as a plurality.

Figure 7:
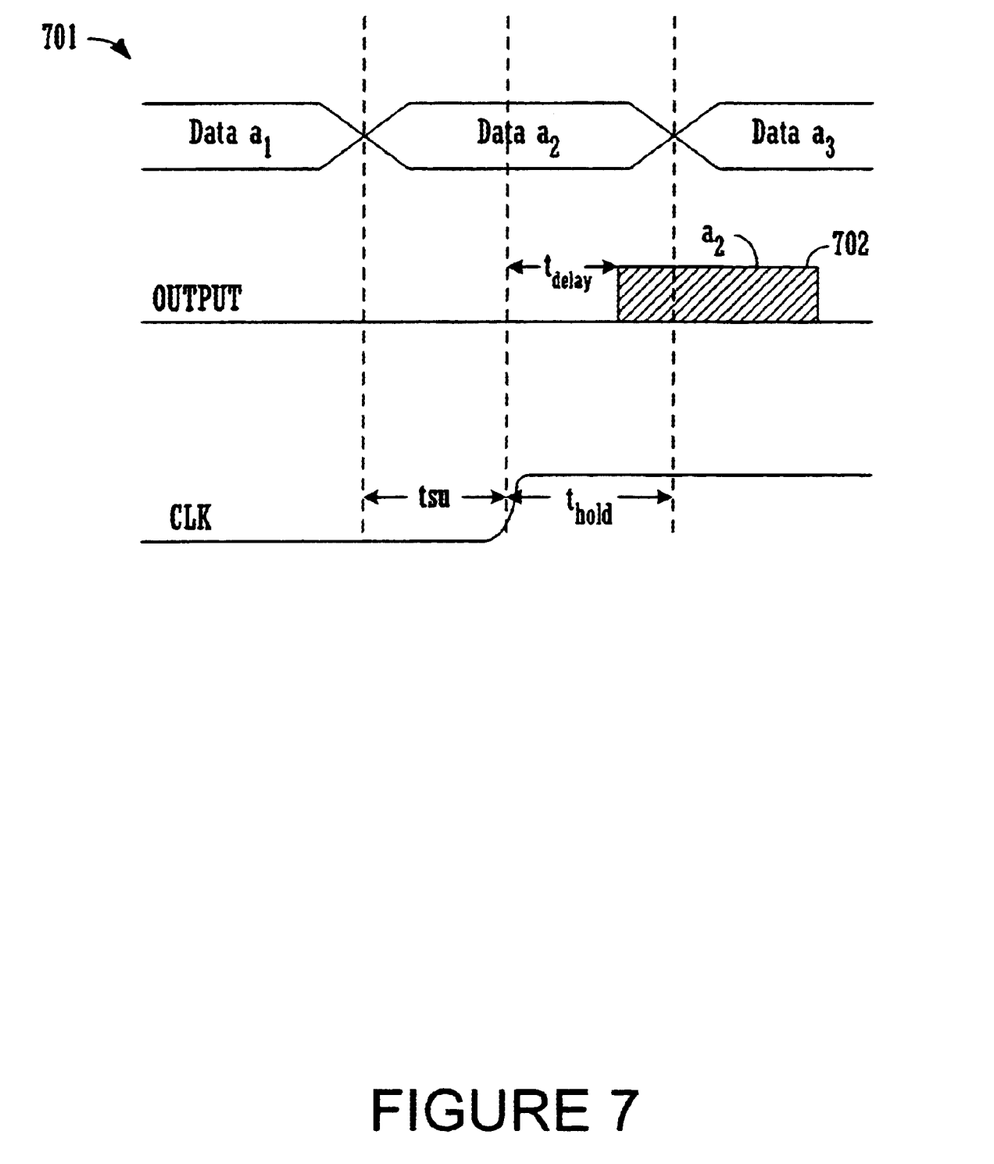
FIG. 7 shows exemplary data and exemplary output associated with a sequential circuit which can be represented by a cell file in accordance with values acquired by the present invention.

FIG. 7 shows an exemplary timing for data 701 and output 702 of a sequential component (e.g., a flip flop). In the one embodiment, the delay value represents the delay time (t delay), which is the time between receipt of clock signal trigger and a corresponding change in the output of the sequential circuit. In one embodiment, the setup value represents the setup time (tsu) associated with circuit 600. Setup time corresponds to the time required between the receipt of a data signal at port 604 and the receipt of a clock at port 605.

Thus the present invention facilitate an efficient automated acquisition of delay, setup and hold values that appropriately reflect the timing characteristics of an integrated circuit. The values are available for inclusion in a cell file for use in convenient and accurate integrated circuit design operations. Timing values for delay, setup and hold characteristics provided by the present invention facilitate the reduction of circuit failures due to timing issues when a design is implemented in silicon. The present invention also assists various design decisions including selection of a maximum operating frequency for an integrated circuit corresponding to a design utilizing timing values acquired via the present invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A timing acquisition method comprising:
    choosing a dock input slope value and data input slope value;
    establishing a plurality of setup time values for said clock input slope value and data input slope value;
    determining a hold time value corresponding to each of said plurality of setup time values for functional failure; and determining a clock transition to output transition delay value for each pair of said plurality of said setup time values and said hold time values.

2. A timing acquisition method of claim 1 further comprising making a decision if additional delay values are desired.

3. A timing acquisition method of claim 2 further comprising examining if a change in delay values exceeds a desired percentage change.

4. A timing acquisition method of claim 2 further comprising analyzing if a current delay value minus a previous delay value is less than a particular percentage.

5. A timing acquisition method of claim 2 further comprising changing each of said plurality of setup time values.

6. A timing acquisition method of claim 2 further comprising choosing a load value.

7. A timing acquisition method of claim 1 further comprising determining timing values corresponding to a minimum sequence time.

8. A timing acquisition method of claim 7 further comprising determining a delay and setup value pair that result in a minimal sum.

9. A timing acquisition method of claim 8 further comprising recording as optimal a delay value, setup value and hold value that correspond to said delay and setup value pair that results in a minimal sum.

10. A timing acquisition method of claim 8 further comprising performing separate iterations of said timing acquisition method to acquire the delay, setup and hold values for each sequential component separately.

11. A timing acquisition method of claim 8 further comprising determining a delay value for varying loads using said optimal setup and hold pair.

12. A timing acquisition method comprising:
selecting a clock and data signal input slope;
sweeping a data setup time through a plurality of data setup time values with respect to the clock;
determining a hold time value for each of said plurality of setup time values; and
determining a delay through a cell for each of said plurality of setup time values and said corresponding hold time values.

13. A timing acquisition method of claim 12 further comprising running a transistor level simulation to determine said delay.

14. A timing acquisition method of claim 12 wherein said delay is determined for varying loads.

15. A timing acquisition method of claim 12 further comprising identifying an optimal delay, setup and hold triplet.

16. A timing acquisition method of claim 15 wherein said optimal delay, setup and hold triplet is selected by analyzing the sum of delay and setup values pairs to determine a minimum and then recording a corresponding delay, setup and hold values.

17. A timing acquisition method of claim 12 wherein optimal delay setup and hold values are utilized to facilitate high frequency designs using the same physical cell layout library.

18. A computer usable medium having a computer readable program code embodied therein for causing a computer system to perform a timing acquisition method comprising:
choosing a clock input slope value and data input slope value;
establishing a plurality of setup time values for said clock input slope value and data input slope value;
determining a hold time value corresponding to each of said plurality of setup time values for functional failure; and
determining a clock transition to output transition delay value for each pair of said plurality of said setup time values and said hold time values.

19. A computer usable medium with timing acquisition method instructions of claim 18 further comprising choosing a different load value, a clock input slope value and data input slope value.

20. A computer usable medium with timing acquisition method instructions of claim 18 wherein said optimal delay setup and hold values are utilized to facilitate high frequency designs using the same physical cell layout library.

* * * * *